United States Patent
Ryu

(10) Patent No.: US 12,141,441 B2
(45) Date of Patent: Nov. 12, 2024

(54) DATA STORAGE DEVICE WITH EFFICIENT CHANGING READ OPTION, AND CONTROLLER, MEMORY DEVICE, AND OPERATING METHOD THEREOF

(71) Applicant: SK hynix Inc., Icheon-si (KR)

(72) Inventor: Tae Kyu Ryu, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 50 days.

(21) Appl. No.: 18/085,279

(22) Filed: Dec. 20, 2022

(65) Prior Publication Data

US 2023/0376208 A1 Nov. 23, 2023

(30) Foreign Application Priority Data

May 19, 2022 (KR) .................. 10-2022-0061264

(51) Int. Cl.
*G06F 3/06* (2006.01)
(52) U.S. Cl.
CPC .......... *G06F 3/0613* (2013.01); *G06F 3/0659* (2013.01); *G06F 3/0679* (2013.01)
(58) Field of Classification Search
CPC . G06F 3/0659; G06F 3/061; G06F 2212/1032
See application file for complete search history.

(56) References Cited

U.S. PATENT DOCUMENTS

| 2014/0136918 A1* | 5/2014 | Katagiri ............ H03M 13/3715 714/755 |
| 2022/0028478 A1* | 1/2022 | Park ...................... G11C 29/44 |

FOREIGN PATENT DOCUMENTS

| KR | 1020170065076 A | 6/2017 |
| KR | 1020200056880 A | 5/2020 |

* cited by examiner

*Primary Examiner* — David Yi
*Assistant Examiner* — Nicholas A. Paperno
(74) *Attorney, Agent, or Firm* — WILLIAM PARK & ASSOCIATES LTD.

(57) ABSTRACT

A data storage device in accordance with an embodiment may include a controller and a memory device. The controller is configured to output a read control signal including an option number related to a read condition. The memory device is configured to perform a read operation based on a read condition corresponding to the option number in response to the read control signal. The read condition for the option number is configured to be stored in a read condition table storage circuit included in the memory device.

14 Claims, 4 Drawing Sheets

DATA STORAGE DEVICE WITH EFFICIENT CHANGING READ OPTION, AND CONTROLLER, MEMORY DEVICE, AND OPERATING METHOD THEREOF

CROSS-REFERENCES TO RELATED APPLICATION

The present application claims priority under 35 U.S.C. § 119(a) to Korean application number 10-2022-0061264, filed on May 19, 2022, in the Korean Intellectual Property Office, which is incorporated herein by reference in its entirety.

BACKGROUND

1. Technical Field

The present technology relates to a semiconductor integrated device, and more particularly, to a data storage device related to read efficiency, and a controller, a memory device, and an operating method related to read efficiency.

2. Related Art

A storage device performs a data input/output operation according to an external request. The storage device may use various storage media in order to store data.

A storage medium using a flash memory supports a large capacity, and its demand continues to increase due to advantages such as non-volatility, low unit cost, low power consumption, and high data processing speed.

With the development of electronic devices, storage media are required to have higher capacity, higher performance, and higher speed. Particularly, in a storage medium used for processing large-capacity data, a data input/output speed acts as a major factor influencing the performance of the storage medium.

SUMMARY

A data storage device in accordance with an embodiment of the present technology may include: a controller configured to output a read control signal including an option number related to a read condition; and a memory device including a read condition table storage circuit, wherein the read condition table storage circuit is configured to store the read condition for the option number, and wherein the memory device is configured to perform a read operation under a read condition corresponding to the option number in response to the read control signal.

A controller in accordance with an embodiment of the present technology may be configured to transmit a first read control signal including an option number related to a read condition to a memory device in response to a first external read request, to generate a second read control signal by changing the option number when a failure of a read operation performed by the memory device on the basis of the first read control signal is detected, and to transmit the second read control signal to the memory device.

A memory device in accordance with an embodiment of the present technology may include: a memory cell array; a read condition table storage circuit configured to store a read condition for each option number; an option determination circuit configured to extract an option number related to a read condition from a read control signal transmitted from an exterior of the memory device, and to detect a read condition corresponding to the extracted option number from the read condition table storage circuit; and control logic configured to read data by operating the memory cell array according to the read condition.

An operating method of a data storage device in accordance with an embodiment of the present technology may include: outputting, by a controller, a read control signal including an option number related to a read condition; and performing, by a memory device, a read operation under a read condition corresponding to the option number in response to the read control signal.

DETAILED DESCRIPTION

Hereinafter, embodiments of the present technology will be described in more detail with reference to the accompanying drawings.

Figure 1:
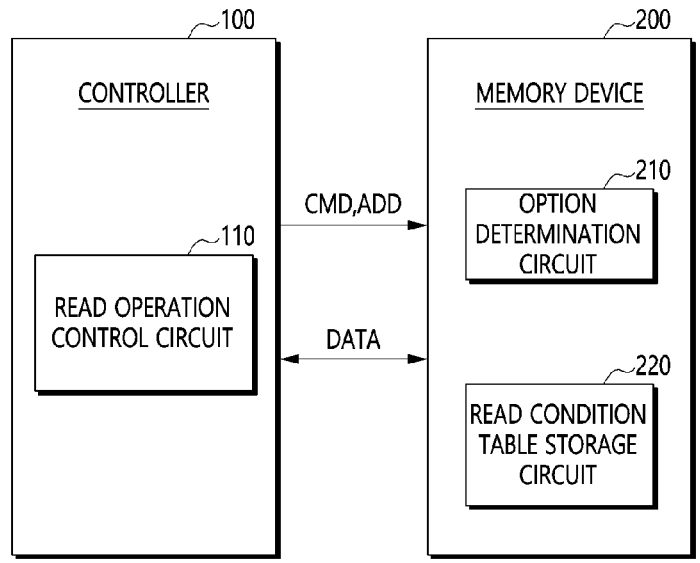
FIG. 1 is a configuration diagram of a data storage device in accordance with an embodiment.

FIG. 1 is a configuration diagram of a data storage device in accordance with an embodiment.

Referring to FIG. 1, the data storage device 10 may include a controller CONTROLLER 100 and a memory device MEMORY DEVICE 200.

The CONTROLLER 100 may transmit a command CMD and an address ADD to the MEMORY DEVICE 200 and write data DATA in the MEMORY DEVICE 200 or read the data DATA stored in the MEMORY DEVICE 200.

The MEMORY DEVICE 200 may perform operations such as writing, reading, and erasing of the data DATA in response to signals received from the CONTROLLER 100.

The MEMORY DEVICE 200 may be implemented by using a memory element selected from various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin torque transfer magnetic RAM (STT-MRAM).

The MEMORY DEVICE 200 includes a memory cell array having memory cells arranged between a plurality of rows (word lines) and a plurality of columns (bit lines). Each memory cell may store 1-bit (single-bit) data or M-bit (multi-bit) data (M is an integer equal to or greater than 2). The MEMORY DEVICE 200 may include a plurality of dies, a plurality of chips, or a plurality of packages.

In an embodiment, the CONTROLLER 100 may include a read operation control circuit 110.

The read operation control circuit 110 may be configured to generate a read control signal indicating a read condition on the basis of the number of read fails of read data output from the MEMORY DEVICE 200. The read condition may include at least one of a read voltage level and a read voltage application time.

In another aspect, when a read control signal including a first read command, an address signal, and a second read command generated, the read operation control circuit 110 may put an option number related to the read condition into at least one of the first read command and the second read command.

In another embodiment, the read operation control circuit 110 may transmit a first read control signal including an option number indicating a read condition to the MEMORY DEVICE 200, and when a failure of a read operation performed by the MEMORY DEVICE 200 in response to the first read control signal is detected, the read operation control circuit 110 may generate a second read control signal by changing the option number and provide the second read control signal to the MEMORY DEVICE 200.

The MEMORY DEVICE 200 may read data on the basis of a read condition determined on the basis of the read control signal or the read command transmitted from the CONTROLLER 100. When the read condition includes a read voltage level, the MEMORY DEVICE 200 may apply, to the memory cell array, a read voltage determined on the basis of the read control signal or the read command. When the read condition includes a read voltage application time, the MEMORY DEVICE 200 may read data by applying a read voltage having a set level to the memory cell array during a read voltage application time determined on the basis of the read control signal or the read command, and provide the read data to the CONTROLLER 100. When the read condition includes the read voltage level and the read voltage application time, the MEMORY DEVICE 200 may provide the CONTROLLER 100 with data read by applying a read voltage determined on the basis of the read control signal or the read command to the memory cell array for a corresponding time.

For example, the MEMORY DEVICE 200 may include an option determination circuit 210 and a read condition table storage circuit 220.

The read condition table storage circuit 220 may store a read condition for each option number. The read condition may include, for example, at least one of a read voltage level and a read voltage application time. In an embodiment, the read condition may be set to a predefined initial value and stored in the read condition table storage circuit 220, and may be changed by the CONTROLLER 100 on the basis of operation history of the data storage device 10.

The option determination circuit 210 may extract an option number related to a read condition from a read control signal or a read command transmitted from the outside.

The option determination circuit 210 and the read condition table storage circuit 220 may be included in control logic CONTROL LOGIC (360 of FIG. 5) within the MEMORY DEVICE 200, and the CONTROL LOGIC may perform a read operation by applying a read voltage level corresponding to the extracted option number to the memory cell array. The control logic 360 may be implemented as hardware, software, or a combination of hardware and software. For example, the control logic 360 may be a control logic circuit operating in accordance with an algorithm and/or a processor executing control logic code. The CONTROL LOGIC 360 will be described below in detail with reference to FIG. 5.

The data retention reliability of the MEMORY DEVICE 200 may decrease as a program/erase (P/E) cycle is accumulated. The CONTROLLER 100 may perform an error correction function in order to correct a read data error occurring due to the decrease in data retention reliability.

When error correction by the error correction function is not possible, the CONTROLLER 100 may perform a read retry operation.

The read retry operation may be an operation of changing the read condition and performing the read operation again. The read condition may include at least one of a read voltage level and a read voltage application time. The read retry operation may be repeatedly performed until the read retry operation is passed within a preset number of times. The word "preset" as used herein with respect to a parameter, such as a preset number of times and preset threshold number, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The data storage device 10 according to the present technology substantially maintains, in the MEMORY DEVICE 200, the read condition table storage circuit 220 indicating a read voltage level and/or a read voltage application time for each option number. The CONTROLLER 100 counts the number of read fails when error correction for read data transmitted from the MEMORY DEVICE 200 is not possible. The CONTROLLER 100 may determine an option number on the basis of the count result of the number of read fails, generate a read control signal including the determined option number, and transmit the read control signal to the MEMORY DEVICE 200.

The MEMORY DEVICE 200 may read data according to a read condition corresponding to the option number extracted from the read control signal, and provide the read data to the CONTROLLER 100.

Figure 2:
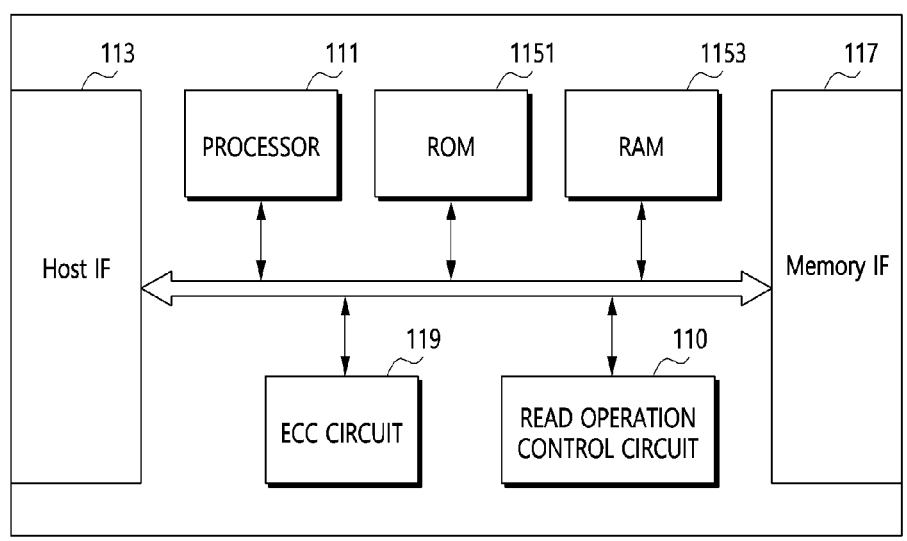
FIG. 2 is a configuration diagram of a controller in accordance with an embodiment.

FIG. 2 is a configuration diagram of the CONTROLLER 100 in accordance with an embodiment.

Referring to FIG. 2, the CONTROLLER 100 in accordance with an embodiment may include a processor 111, a host interface Host IF 113, a ROM 1151, a RAM 1153, a memory interface Memory IF 117, an error Check and Correction (ECC) circuit 119, and the read operation control circuit 110.

The processor 111 may control an overall operation of the CONTROLLER 100. In an embodiment, the processor 111 may be configured to transfer various control information required for a read or write operation of data for the MEMORY DEVICE 200 to the Host IF 113, the RAM 1153, the Memory IF 117, and the ECC circuit 119. In an embodiment, the processor 111 may be configured as hardware capable of executing firmware provided for various operations of the data storage device 10. In an embodiment, the processor 111 may perform a function of a flash translation layer (FTL) for performing garbage collection, address mapping, wear leveling, and the like for managing the MEMORY DEVICE 200.

The Host IF 113 may receive a command, an address, and a clock signal from a host device under the control of the processor 111 and, in some cases, further receive data to provide a communication channel for controlling data input/output. Particularly, the Host IF 113 may provide a physical connection between the host device and the data storage device 10. Furthermore, the Host IF 113 may provide interfacing with the data storage device 10 in correspondence to a bus format of the host device. The bus format of the host device may include at least one of standard interface protocols such as a secure digital, a universal serial bus (USB), a multi-media card (MMC), an embedded MMC (eMMC), a personal computer memory card international association (PCMCIA), a parallel advanced technology attachment (PATA), a serial advanced technology attachment (SATA), a small computer system interface (SCSI), a serial attached SCSI (SAS), a peripheral component interconnection (PCI), a PCI express (PCI-E), and a universal flash storage (UFS).

The ROM 1151 may store program codes necessary for the operation of the CONTROLLER 100, for example, firmware or software, and may store code data and the like used by the program codes.

The RAM 1153 may store data required for the operation of the CONTROLLER 100 or data generated by the CONTROLLER 100. That is, the RAM 1153 may be used as a cache memory, a buffer memory, a working memory, and the like of the CONTROLLER 100.

The Memory IF 117 may provide a communication channel for signal transmission/reception between the CONTROLLER 100 and the MEMORY DEVICE 200. The Memory IF 117 may transmit data stored in the buffer memory to the MEMORY DEVICE 200 or transfer data read from the MEMORY DEVICE 200 to the buffer memory, under the control of the processor 111.

The ECC circuit 119 may be configured to detect and correct an error in data exchanged with the MEMORY DEVICE 200. In an embodiment, the ECC circuit 119 may ECC-encode data to be stored in the MEMORY DEVICE 200 and ECC-decode data read from the MEMORY DEVICE 200.

The read operation control circuit 110 may be configured to generate a read control signal indicating a read condition on the basis of the number of read fails of read data output from the MEMORY DEVICE 200. The read condition may include at least one of a read voltage level and a read voltage application time.

Figure 3:
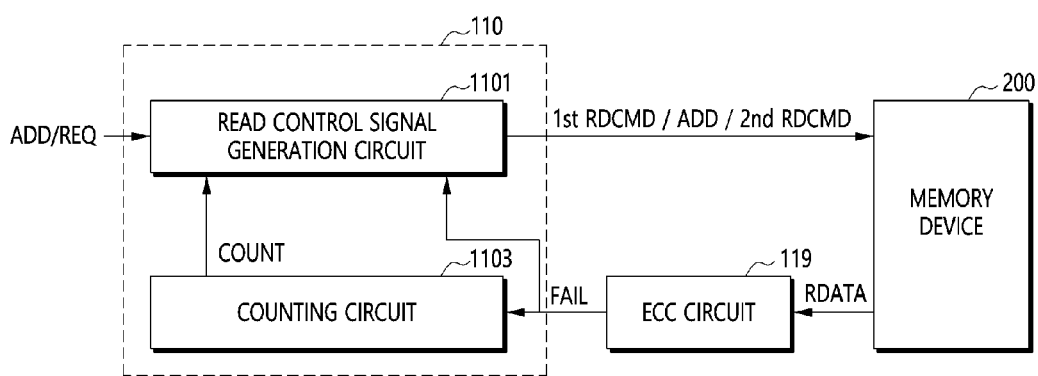
FIG. 3 is a conceptual diagram for explaining an operation of a read operation control circuit accordance with an embodiment.

FIG. 3 is a conceptual diagram for explaining an operation of the read operation control circuit 110 accordance with an embodiment.

Referring to FIG. 3, the read operation control circuit 110 may include a read control signal generation circuit 1101 and a counting circuit 1103.

The read control signal generation circuit 1101 may generate a read control signal in response to an address ADD and a read request REQ provided from the outside, for example, the host device. The read control signal may include a first read command 1st RDCMD, an address signal ADD, and a second read command 2nd RDCMD, and the read control signal generation circuit 1101 may put an option number related to a read condition into at least one of the first read command 1st RDCMD and the second read command 2nd RDCMD.

Read data RDATA provided by the MEMORY DEVICE 200 may be provided to the ECC circuit 119. When error correction of the read data RDATA is not possible, the ECC circuit 119 may generate a read fail signal FAIL and provide the read fail signal FAIL to the read control signal generation circuit 1101 and the counting circuit 1103.

Upon receiving the read fail signal FAIL, the read control signal generation circuit 1101 may regenerate a read control signal for a read-failed read request on the basis of a counting signal COUNT provided from the counting circuit 1103.

The counting circuit 1103 may transmit the counting signal COUNT to the read control signal generation circuit 1101, the counting signal COUNT being obtained by accumulatively counting the number of generations of the read fail signal FAIL for each read request REQ.

That is, the read control signal generation circuit 1101 may transmit a first read control signal including an option number indicating a read condition to the MEMORY DEVICE 200, and when a failure of a read operation performed by the MEMORY DEVICE 200 in response to the first read control signal is detected, the read control signal generation circuit 1101 may generate a second read control signal by changing the option number and provide the second read control signal to the MEMORY DEVICE 200. The option number related to the read condition may be determined on the basis of the number of fails of read data.

In an embodiment, a read retry operation may be repeatedly performed until the read retry operation is passed within a preset threshold number. Accordingly, when the counting signal COUNT provided from the counting circuit 1103 is equal to or less than a preset threshold number, the read control signal generation circuit 1101 may regenerate a read control signal, and when the counting signal COUNT exceeds the preset threshold number, the read control signal generation circuit 1101 may process the read operation as a failure.

When a read voltage level for performing the read retry operation is transmitted through a read command, that is, a command separate from the read control signal, additional time may be required for this transmission. Unlike this, since the present technology transmits the read command including the read condition, a separate time or cycle for transmitting the read condition can be eliminated.

Figure 4:
FIG. 4 is a diagram for explaining a read operation accordance with an embodiment.

FIG. 4 is a diagram for explaining a read operation in accordance with an embodiment.

The read control signal may include a first read command 1st RDCMD, an address signal ADD, and a second read command 2nd RDCMD.

After the first read command (1st RDCMD, for example, 00 h) is issued from the CONTROLLER 100 to the MEMORY DEVICE 200 in order to instruct a read operation, the address ADD is input, and the second read command (2nd RDCMD, for example, 30 h) is input and the read operation is started. In a busy period tR in which the read operation is performed, data stored in a memory cell may be prepared in a buffer, for example, a page buffer. After the busy period BUSY, read data may be output DOUT from the MEMORY DEVICE 200 to the CONTROLLER 100.

The CONTROLLER 100 according to the present technology may put information related to a read condition into a read control signal transmitted in order to start a read operation, that is, at least one of the first read command 1st RDCMD, for example, 00 h and the second read command 2nd RDCMD, for example, 30 h, and may transmit the read control signal including the read condition. In addition, the MEMORY DEVICE 200 may query a read condition table according to the read condition determined on the basis of the read condition included in the read control signal, determine the read condition, and thus provide read data to the CONTROLLER 100.

Figure 5:
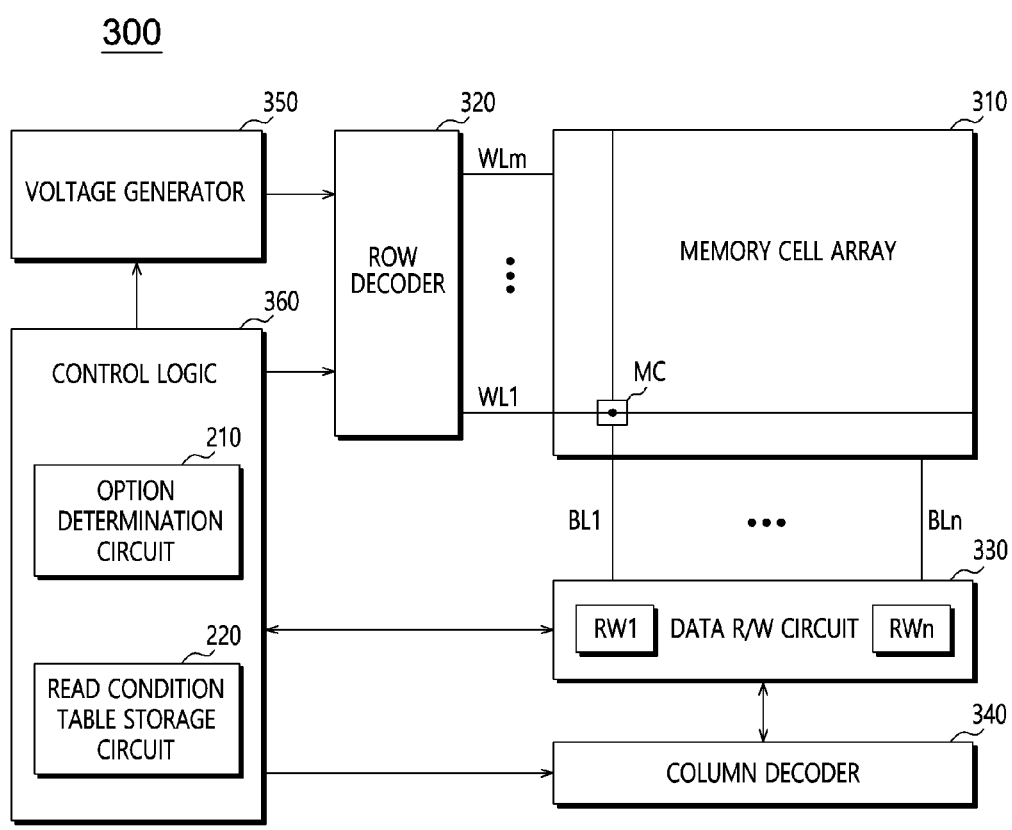
FIG. 5 is a configuration diagram of a memory device in accordance with an embodiment.

FIG. 5 is a configuration diagram of a memory device in accordance with an embodiment and illustrates a nonvolatile memory device 300.

Referring to FIG. 5, the nonvolatile memory device 300 may include a memory cell array MEMORY CELL ARRAY 310, a row decoder ROW DECODER 320, a data read/write circuit DATA R/W (READ/WRITE) CIRCUIT 330, a column decoder COLUMN DECODER 340, a voltage generator VOLTAGE GENERATOR 350, and the control logic CONTROL LOGIC 360.

The MEMORY CELL ARRAY 310 may include memory cells MC arranged in an area where word lines WL1 to WLm and bit lines BL1 to BLn cross each other.

The MEMORY CELL ARRAY 310 may include a three-dimensional memory array. The three-dimensional memory array has a directionality perpendicular to a flat surface of a semiconductor substrate, and refers to a structure including a NAND string in which at least one memory cell is located vertically above another memory cell. However, the structure of the three-dimensional memory array is not limited thereto, and it is obvious that a memory array structure formed at high density with horizontal directionality as well as vertical directionality can be selectively applied.

The ROW DECODER 320 may be connected to the MEMORY CELL ARRAY 310 through the word lines WL1 to WLm. The ROW DECODER 320 may operate under the control of the CONTROL LOGIC 360. The ROW DECODER 320 may decode an address provided from an external device (not illustrated). The ROW DECODER 320 may select and drive the word lines WL1 to WLm on the basis of a decoding result. For example, the ROW DECODER 320 may provide the word lines WL1 to WLm with a word line voltage provided from the VOLTAGE GENERATOR 350.

The DATA R/W CIRCUIT 330 may be connected to the MEMORY CELL ARRAY 310 through the bit lines BL1 to BLn. The DATA R/W CIRCUIT 330 may include read/write circuits RW1 to RWn corresponding to the bit lines BL1 to BLn, respectively. The DATA R/W CIRCUIT 330 may operate under the control of the CONTROL LOGIC 360. The DATA R/W CIRCUIT 330 may operate as a write driver or a sense amplifier according to an operation mode. For example, the DATA R/W CIRCUIT 330 may operate as a write driver that stores data provided from an external device in the MEMORY CELL ARRAY 310 during a write operation. As another example, the DATA R/W CIRCUIT 330 may operate as a sense amplifier that reads data from the MEMORY CELL ARRAY 310 during a read operation.

The COLUMN DECODER 340 may operate under the control of the CONTROL LOGIC 360. The COLUMN DECODER 340 may decode an address provided from an external device. The COLUMN DECODER 340 may connect the read/write circuits RW1 to RWn of the DATA R/W CIRCUIT 330 respectively corresponding to the bit lines BL1 to BLn and a data input/output line (or a data input/output buffer) on the basis of a decoding result.

The VOLTAGE GENERATOR 350 may generate a voltage used for the operation of the nonvolatile memory device 300. Voltages generated by the VOLTAGE GENERATOR 350 may be applied to the memory cells of the MEMORY CELL ARRAY 310. For example, a program voltage generated during a program operation may be applied to word lines of memory cells on which a program operation is to be performed. As another example, an erase voltage generated during an erase operation may be applied to a well region of memory cells on which an erase operation is to be performed. As another example, a read voltage generated during a read operation may be applied to word lines of memory cells on which a read operation is to be performed.

The CONTROL LOGIC 360 may control overall operations of the nonvolatile memory device 300 on the basis of a control signal provided from an external device. For example, the CONTROL LOGIC 360 may control read, write, and erase operations of the nonvolatile memory device 300.

The CONTROL LOGIC 360 may include the option determination circuit 210 and the read condition table storage circuit 220 described with reference to FIG. 1 to FIG. 4.

Figure 6:
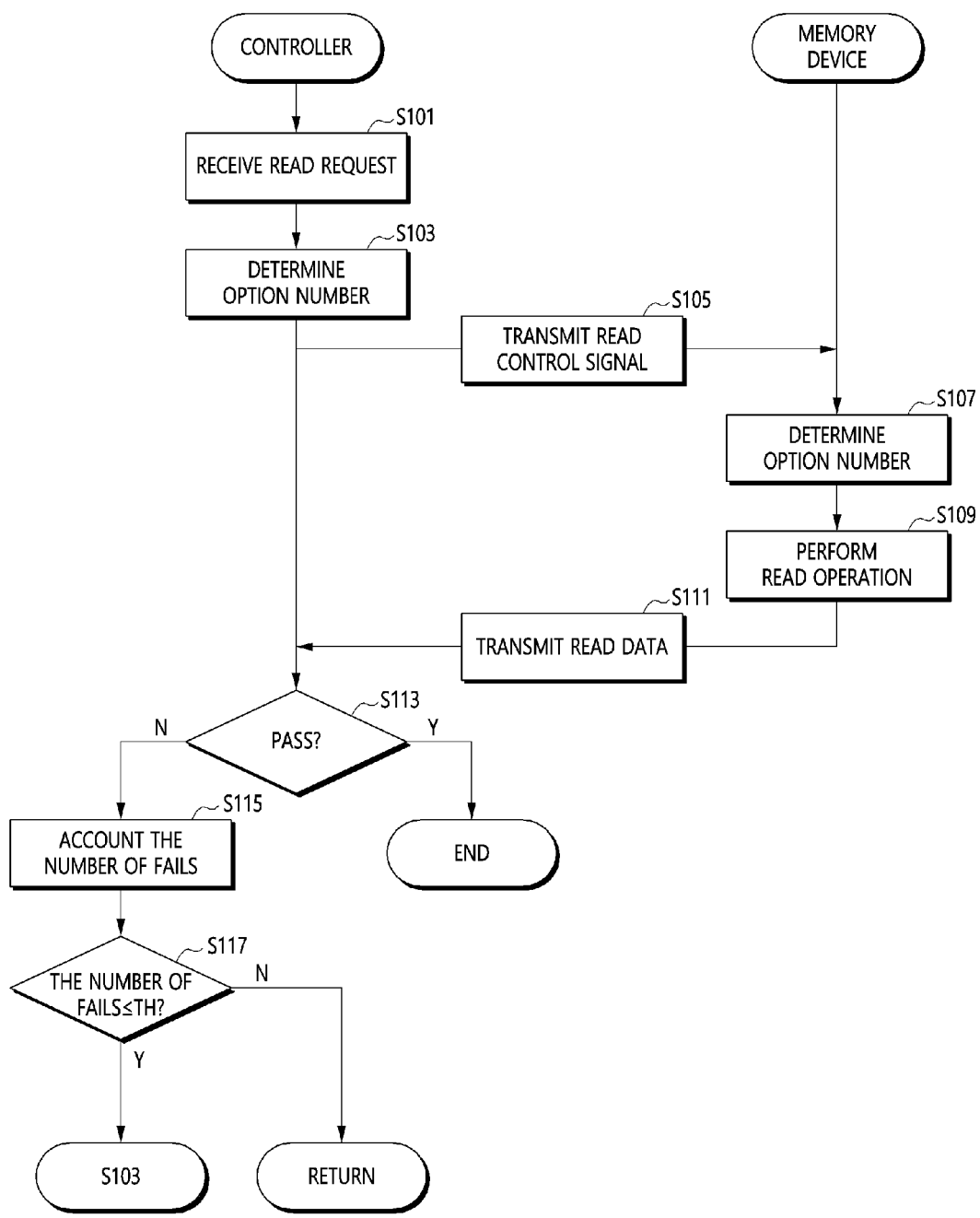
FIG. 6 is a flowchart for explaining a method of operating the data storage device accordance with an embodiment.

FIG. 6 is a flowchart for explaining a method of operating the data storage device 10 in accordance with an embodiment.

The CONTROLLER 100 may receive a read request including an address from the outside, for example, the host device (S101). In an embodiment, a read request from the outside that is received by the CONTROLLER 100 may be a first external read request including an address.

In order to operate the MEMORY DEVICE 200 according to the read request, the CONTROLLER 100 may determine an option number on the basis of the count result of the number of read fails (S103), and generate a read control signal including the determined option number and transmit the read control signal to the MEMORY DEVICE 200 (S105).

In an embodiment, the read control signal may include the first read command 1st RDCMD, the address signal ADD, and the second read command 2nd RDCMD, and the CONTROLLER 100 may put an option number related to a read condition into at least one of the first read command 1st RDCMD and the second read command 2nd RDCMD.

The MEMORY DEVICE 200 may extract an option number from the read control signal (S107) and perform a read operation according to a read condition corresponding to the extracted option number (S109). Read data according to the read operation may be transmitted to the CONTROLLER 100 (S111).

The CONTROLLER 100 may determine whether the read operation has been successfully performed, that is, whether there is no error in the read data or an error in the read data is correctable (S113), and when the read operation has passed (S113:Y), the CONTROLLER 100 may end the read operation.

However, when the read operation has failed (S113: N), the CONTROLLER 100 may accumulatively count the number of read fails (S115).

The CONTROLLER 100 may compare the number of read fails with a preset threshold number TH (S117), and when the number of read fails is equal to or less than the preset threshold number TH (S117:Y), the CONTROLLER 100 may perform the process (S103) of determining an option number on the basis of the number of read fails. When the number of read fails exceeds the preset threshold number TH (S117:N), the CONTROLLER 100 may return to the outside that the read operation has failed.

A person skilled in the art to which the present disclosure pertains can understand that the present disclosure may be carried out in other specific forms without changing its technical spirit or essential features. Therefore, it should be understood that the embodiments described above are illustrative in all respects, not limitative. The scope of the present disclosure is defined by the claims to be described below rather than the detailed description, and it should be construed that the meaning and scope of the claims and all changed or modified forms derived from the equivalent concept thereof are included in the scope of the present disclosure.

What is claimed is:

1. A data storage device comprising:
   a controller configured to output a read control signal including an option number related to a read condition; and
   a memory device including a read condition table storage circuit, wherein the read condition table storage circuit is configured to store the read condition for the option number, and wherein the memory device is configured to perform a read operation based on a read condition corresponding to the option number in response to the read control signal, wherein the read control signal includes a first read command and a second read command, and the option number is included in at least one of the first read command or the second read command.

2. The data storage device according to claim 1, wherein, when there is a plurality of option numbers, the read condition table storage circuit stores a read condition for each of the plurality of option numbers.

3. The data storage device according to claim 1, wherein the read control signal further includes an address signal, and wherein, when the address signal is output from the controller to the memory device, the address signal is transmitted between the first read command and the second read command.

4. The data storage device according to claim 1, wherein, when error correction of read data transmitted from the memory device to the controller in response to a first external read request received by the controller is not possible, the controller counts the number of read fails for the first read request, and the option number is determined on the basis of the number of read fails.

5. The data storage device according to claim 1, wherein the read condition includes at least one of a read voltage level and a read voltage application time.

6. A controller configured to transmit a first read control signal including an option number related to a read condition to a memory device in response to a first external read request, to generate a second read control signal by changing the option number when a failure of a read operation performed by the memory device on the basis of the first read control signal is detected, and to transmit the second read control signal to the memory device, wherein each of the first read control signal and the second read control signal includes a first read command and a second read command, and the option number is included in at least one of the first read command or the second read command.

7. The controller according to claim 6, wherein each of the first read control signal and the second read control signal further includes an address signal, and wherein when the address signal is output from the controller to the memory device, the address signal is transmitted between the first read command and the second read command.

8. The controller according to claim 6, wherein the option number is determined according to the number of failures of a read operation for the first read request.

9. The controller according to claim 6, wherein the read condition includes at least one of a read voltage level and a read voltage application time.

10. A method for operating a data storage device, the method comprising:

outputting, by a controller, a read control signal including an option number related to a read condition; and performing, by a memory device, a read operation based on a read condition corresponding to the option number in response to the read control signal, wherein the controller generates the read control signal to include a first read command and a second read command, and the option number is included in at least one of the first read command or the second read command.

11. The method according to claim 10, further comprising:

storing, by the controller, the read condition for each option number in the memory device.

12. The method according to claim 10, wherein the controller generates the read control signal to further include an address signal, the address signal is transmitted between the first read command and the second read command when the address signal is output from the controller to the memory device.

13. The method according to claim 10, further comprising:

counting, by the controller, the number of read fails for the first read request when error correction of read data transmitted from the memory device in response to a first external read request is not possible; and determining, by the controller, the option number on the basis of the number of read fails.

14. The method according to claim 10, wherein the read condition includes at least one of a read voltage level and a read voltage application time.

* * * * *